United States Patent
Makino et al.

(10) Patent No.: US 6,976,526 B2
(45) Date of Patent: *Dec. 20, 2005

(54) HEAT TRANSPORT DEVICE AND ELECTRONIC DEVICE

(75) Inventors: Takuya Makino, Kanagawa (JP); Masaki Hara, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/086,361

(22) Filed: Mar. 23, 2005

(65) Prior Publication Data

US 2005/0161198 A1    Jul. 28, 2005

Related U.S. Application Data

(63) Continuation of application No. 10/724,838, filed on Dec. 2, 2003, now Pat. No. 6,942,021.

(30) Foreign Application Priority Data

Dec. 12, 2002 (JP) .............................. 2002-361019

(51) Int. Cl.[7] ............................................ F28D 15/04
(52) U.S. Cl. ............. 165/104.26; 165/272; 165/104.27
(58) Field of Search ................................ 165/272–274, 165/104.21–104.27

(56) References Cited

U.S. PATENT DOCUMENTS

| | | | |
|---|---|---|---|
| 4,687,048 A | 8/1987 | Edelstein et al. | |
| 4,770,238 A | 9/1988 | Owen | |
| 4,917,173 A | 4/1990 | Brown et al. | |
| 5,010,951 A * | 4/1991 | Kapolnek et al. | 165/104.26 |
| 5,642,776 A | 7/1997 | Meyer et al. | |
| 5,725,049 A | 3/1998 | Swanson et al. | |
| 6,085,831 A * | 7/2000 | DiGiacomo et al. | 165/104.33 |
| 6,388,882 B1 | 5/2002 | Hoover et al. | |
| 6,437,981 B1 | 8/2002 | Newton et al. | |
| 6,474,074 B2 | 11/2002 | Ghoshal | |
| 6,698,503 B2 * | 3/2004 | Son et al. | 165/104.26 |
| 2005/0047090 A1 * | 3/2005 | Tonosaki et al. | 361/700 |

* cited by examiner

*Primary Examiner*—Teresa J. Walberg
(74) *Attorney, Agent, or Firm*—Oblon, Spivak, McClelland, Maier & Neustadt, P.C.

(57) ABSTRACT

A heat transport device includes an evaporator, a condenser, and a vapor channel and a plurality of liquid channels that connect the evaporator and the condenser. The evaporator generates a capillary force to circulate working fluid. This structure prevents the performance deterioration and malfunction due to the entry of vapor-phase working fluid into the liquid channels. Since the cross-sectional areas of the liquid channels gradually decrease from the condenser toward the evaporator, the capillary force at the liquid channels can be increased, and vapor-phase working fluid is prevented from entering the liquid channels. Wicks and the portions of the liquid channels adjacent thereto are filled with liquid-phase working fluid even after dryout occurs, stable operation is achieved.

1 Claim, 9 Drawing Sheets

HEAT TRANSPORT DEVICE AND ELECTRONIC DEVICE

CROSS REFERENCE TO RELATED APPLICATION

This application is a continuation of application Ser. No. 10/724,838, filed Dec. 2, 2003, now U.S. Pat. No. 6,942,021, the entire contents being incorporated herewith by reference.

BACKGROUND OF THE INVENTION

1. Field of the Invention

The present invention relates to a heat transport device having an evaporator and a condenser, and an electronic device. More particularly, the present invention relates to a heat transport technique that achieves size and thickness reduction by using a CPL (capillary pumped loop), a loop heat pipe, or the like in the field of fluid MEMS (micro-electro-mechanical systems).

2. Description of the Related Art

Various devices (e.g., heat pipes, heat sinks, and radiating fins) are widely used for heat radiation and cooling. Because of recent advances in the electronic device technology and micromachining technology, compact devices can be produced. For the production of such compact devices, so-called MEMS technology using a semiconductor manufacturing technology has received attention, and studies have been made to apply the MEMS technology to heat transport devices. This is because heat-source cooling systems adapted for compact and high-performance electronic devices are required, and because heat must be efficiently radiated from devices, such as CPUs (central processing units), which have markedly increased in performance, for example, processing speed.

In a capillary pumped loop, for example, the cycle in which heat is radiated from an object by vaporizing coolant in an evaporator, and the vaporized coolant is returned into liquid in a condenser is repeated, as disclosed in Jeffrey Kirshberg, Dorian Liepmann, Kirk L. Yerkes, "Micro-Cooler for Chip-Level Temperature Control", Aerospace Power Systems Conference Proceedings (US), Society of Automotive Engineers, Inc., April 1999, P-341, pp. 233 to 238.

In a system configuration including an evaporator and a condenser, heat transport is basically conducted in the following manner:

(1) Liquid-phase working fluid fed from the condenser reaches the evaporator through a liquid channel, and is vaporized in the evaporator by heat from the outside.

(2) The vaporized working fluid flows at high speed toward the condenser through a vapor channel, and radiates heat in the condenser to return to liquid again.

(3) The above heat transport processes (1) and (2) are repeated in a closed pipe.

However, the known devices have the following problems with the heat transport efficiency and ability.

In a heat transport system including an evaporator and a condenser, when vapor in the vapor channel radiates heat and condenses into a liquid phase before reaching the condenser, the movement of the vapor is hindered by the liquid, and the heat transport efficiency may decline.

When liquid in the liquid channel is vaporized by heat from the outside before reaching the evaporator, the movement of the liquid is hindered by the vapor, and the heat transport efficiency may decline.

In an initial state at the beginning of operation, the liquid channel and a wick (serving to hold and circulate working fluid) must be filled with liquid-phase working fluid. Therefore, in order to perform stable heat transport, the cross-sectional areas of the liquid channel need to be decreased to increase the force of holding the liquid-phase working fluid by the capillary force.

In this case, if the fluid resistance increases in the liquid channel, the distance in which heat transport is possible may be decreased, and the heat quantity may be reduced. That is, in a heat transport device in which working fluid is circulated by a limited capillary force of the wick, the heat transport efficiency (the distance over which heat is transported, and the amount of heat to be transported) declines. In particular, when the device is restarted after dryout (a phenomenon in which the evaporator gets dry) is caused by excessive thermal input, working fluid is not supplied to the wick, and as a result, the heat transport device may not work.

As a solution to the problem resulting from the phase change of working fluid due to the heat exchange between the vapor channel and the liquid channel, and the outside (the flow of the working fluid is hindered, and the heat transport efficiency declines), a method is known in which heat exchange with the outside is suppressed in a large system by covering the vapor channel and the liquid channel with an insulating member. However, this method complicates the configuration of the heat transport device, and cannot be similarly applied to small heat transport devices in which channels for working fluid are provided in a substrate. In such devices that attach importance to a small and thin structure, few means have been taken to suppress the heat exchange with the outside, and therefore, the heat transport efficiency is decreased.

SUMMARY OF THE INVENTION

Accordingly, it is an object of the present invention to provide a compact and thin heat transport device that achieves high heat transport ability and high heat transport efficiency.

According to an aspect, the present invention provides a heat transport device including an evaporator, a condenser, and a plurality of liquid channels that connect the evaporator and the condenser, wherein the evaporator generates a capillary force to circulate working fluid.

A plurality of liquid channels can prevent the performance deterioration and malfunction of the device due to the entry of vapor-phase working fluid into the liquid channels. For example, even if the circulation of liquid-phase working fluid is hindered by the entry of vapor-phase working fluid into one liquid channel, the liquid-phase working fluid is supplied to the wick through the remaining well-conditioned liquid channels, and therefore, dryout or the like can be prevented. As a result, the heat transport ability and efficiency can be enhanced.

Preferably, the cross-sectional areas of the liquid channels at right angles to the longitudinal direction gradually decrease from the condenser toward the evaporator.

This can increase the capillary force of the liquid channels, and can prevent vapor-phase working fluid from entering the liquid channels. Consequently, even after dryout is caused by excessive input, the wick and the liquid channels adjacent thereto are filled with liquid-phase working fluid, and therefore, stable operation can be achieved.

In a case in which a plurality of liquid channels are provided, and the cross-sectional areas of the liquid channels gradually decrease from the condenser toward the evaporator, it is possible to reduce pressure loss caused by the flow of liquid-phase working fluid in the liquid channels.

Further objects, features and advantages of the present invention will become apparent from the following description of the preferred embodiments with reference to the attached drawings.

DESCRIPTION OF THE PREFERRED EMBODIMENTS

A heat transport device of the present invention is suitably used for devices using a capillary pumped loop, a loop heat pipe, and the like, and is applicable to radiating and cooling systems in various electronic devices. For example, in applications to information processing devices, such as computers, portable devices, and the like, the heat transport device is effective in enhancing the efficiency of radiation and cooling of various devices (e.g., CPUs, image pickups, light emitting elements, driving motors for use in small hard disk drives and drives for optical media, and actuators used in a thermally strict condition) without increasing the size and thickness of the devices.

Herein, the "heat transport device" means, in a narrow sense, a device for transporting heat from a heating element with working fluid or the like, but means, in a broad sense, the entire system including a heating element, a cooling or radiating means, a temperature controller, and so on.

Figure 1:
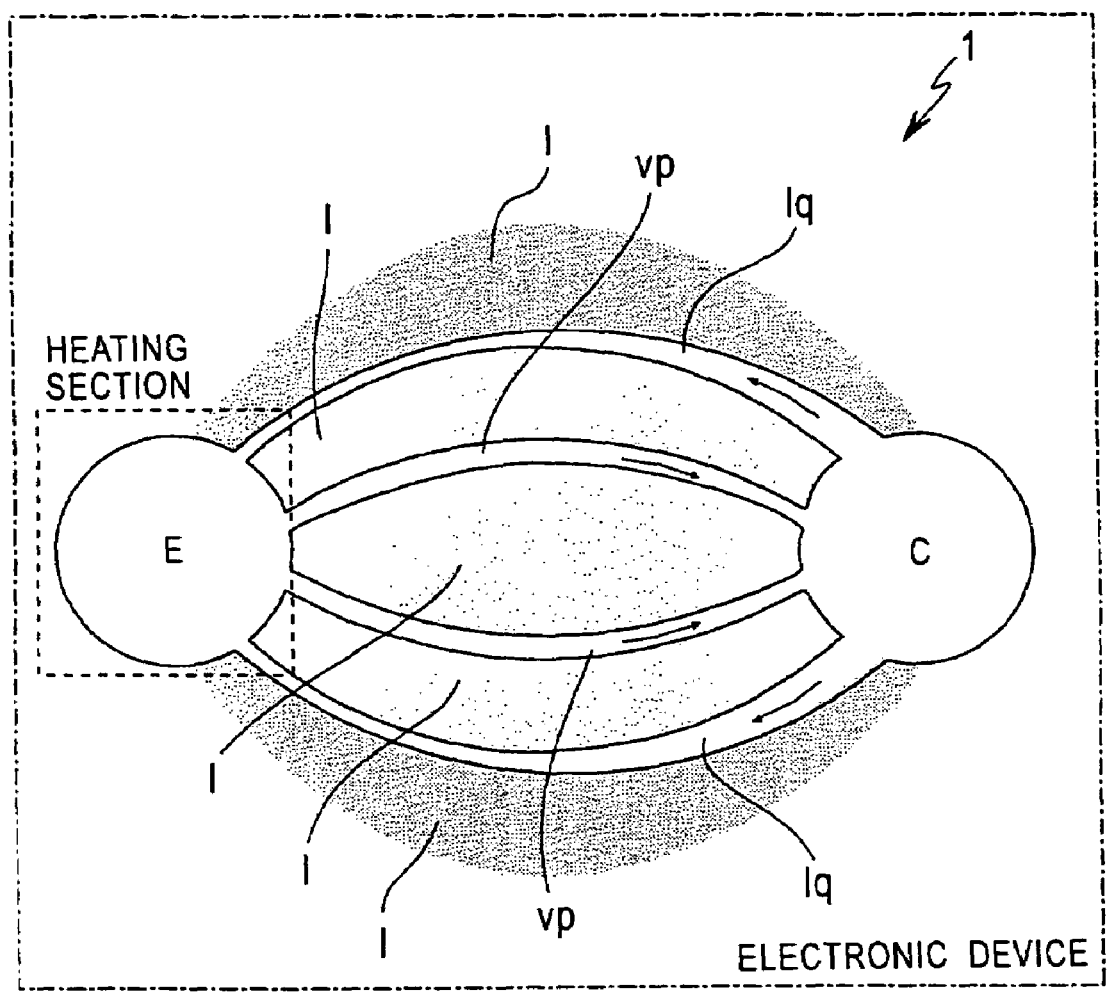
FIG. 1 is a conceptual view showing the basic configuration of the present invention.

FIG. 1 is a conceptual view showing the basic configuration of a heat transport device according to the present invention.

A heat transport device 1 includes an evaporator E in which liquid-phase working fluid evaporates, and a condenser C in which vapor-phase working fluid condenses. While one evaporator E and one condenser C are shown in FIG. 1 for convenience of explanation, the present invention is not limited to such one-to-one correspondence. Of course, a plurality of evaporators may be provided corresponding to a condenser, and a plurality of condensers may be provided corresponding to an evaporator.

The heat transport device 1 also includes liquid channels lq through which liquid-phase working fluid flows, and vapor channels vp through which vapor-phase working fluid flows. The liquid channels lq and the vapor channels vp link the evaporator E and the condenser C.

As shown in FIG. 1, liquid-phase working fluid is transported from the condenser C to the evaporator E through a plurality of liquid channels lq. The number of vapor channels vp is not limited, and at least one vapor channel is provided. Vapor-phase working fluid is transported from the evaporator E to the condenser C through one or more vapor channels.

The evaporator E has a structure (a so-called wick) for generating a capillary force to circulate working fluid, and the structure is formed by grooves, mesh, wires, sintered metal, or the like (in the following embodiment, a wick having grooves are provided on a substrate).

For example, as shown by a dotted line in FIG. 1, when a heating section (e.g., electronic component or heating element) in an electronic device is thermally connected to the evaporator E, and a radiating or cooling means is thermally connected to the condenser C, liquid-phase working fluid reaches the evaporator E through the liquid channels lq, and is evaporated by heat from the heating section. Vapor-phase working fluid flows to the condenser C through the vapor channels vp, and emits heat to return into liquid. Such a cycle is formed in the heat transport device 1.

In this configuration, when vapor-phase fluid is mixed in the wick of the evaporator E and a portion of the liquid channel adjacent to the wick, and is heated in this state, vaporization is promoted, and the vapor-phase component grows and closes a part of the liquid channel. Therefore, liquid-phase working fluid is not supplied to the wick, and heat transport is not performed as planned.

It is a simple solution to the above problem to make the liquid channels lq uniformly thin from the condenser C to the evaporator E. This method is more effective in preventing the entry of vapor-phase working fluid. However, in the heat transport device in which liquid-phase working fluid is circulated by the capillary force of the wick, for example, the heat transport distance must be shortened, or the maximum heat transport ability must be reduced, because it is difficult to generate an extremely strong capillary force.

Accordingly, a heat transport device according to an embodiment of the present invention has the following features in order to enhance the heat transport ability:

(1) A plurality of liquid channels are provided.

(2) Stable operation is achieved by thinning the liquid channels adjacent to a wick. That is, the cross-sectional areas of the liquid channels at right angles to the longitudinal direction are made larger on the side of the condenser than on the side of the evaporator.

(3) The cross-sectional areas of the liquid channels at right angles to the longitudinal direction are gradually decreased from the condenser toward the evaporator (this will be described in detail later).

That is, pressure loss due to liquid-phase working fluid in a liquid channel is increased by locally thinning the liquid channel adjacent to the wick. In order to reduce the pressure loss, it is preferable that a plurality of liquid channels be provided, and that the cross-sectional areas of the liquid channels be gradually decreased from the condenser toward the evaporator. This is also preferable from the viewpoints of the prevention of dryout and the improvement of the reliability, because, even when one of the liquid channels is filled with vapor-phase working fluid and the flow of liquid-phase working fluid is thereby blocked, the liquid-phase working fluid can be supplied to the wick through the other liquid channels.

In the present invention, as shown in FIG. 1, insulating sections I are provided along the liquid channels lq and vapor channels vp to suppress heat transmission between the channels. Therefore, heat exchange between the vapor and liquid channels and the outside can be suppressed. That is, since working fluid does not change its phase while flowing in the liquid and vapor channels, it can flow stably. This enhances the heat transport efficiency. As will be described later, for example, the insulating sections I are hermetically sealed cavities or open cavities. The insulating sections I are provided, for example, between the liquid and vapor channels and outside the channels, as shown in FIG. 1. Alternatively, insulating sections may be provided in other fashions. For example, a double pipe structure may be adopted in which an inner pipe is used for vapor and liquid channels, and the space between the inner pipe and an outer pipe may be placed in a reduced-pressure state or may be filled with a gas having a low thermal conductivity to serve as an insulating section.

FIGS. 2 to 9 show the configuration of a heat transport device according to an embodiment of the present invention. The heat transport device is used in a horizontal position.

Figure 2:
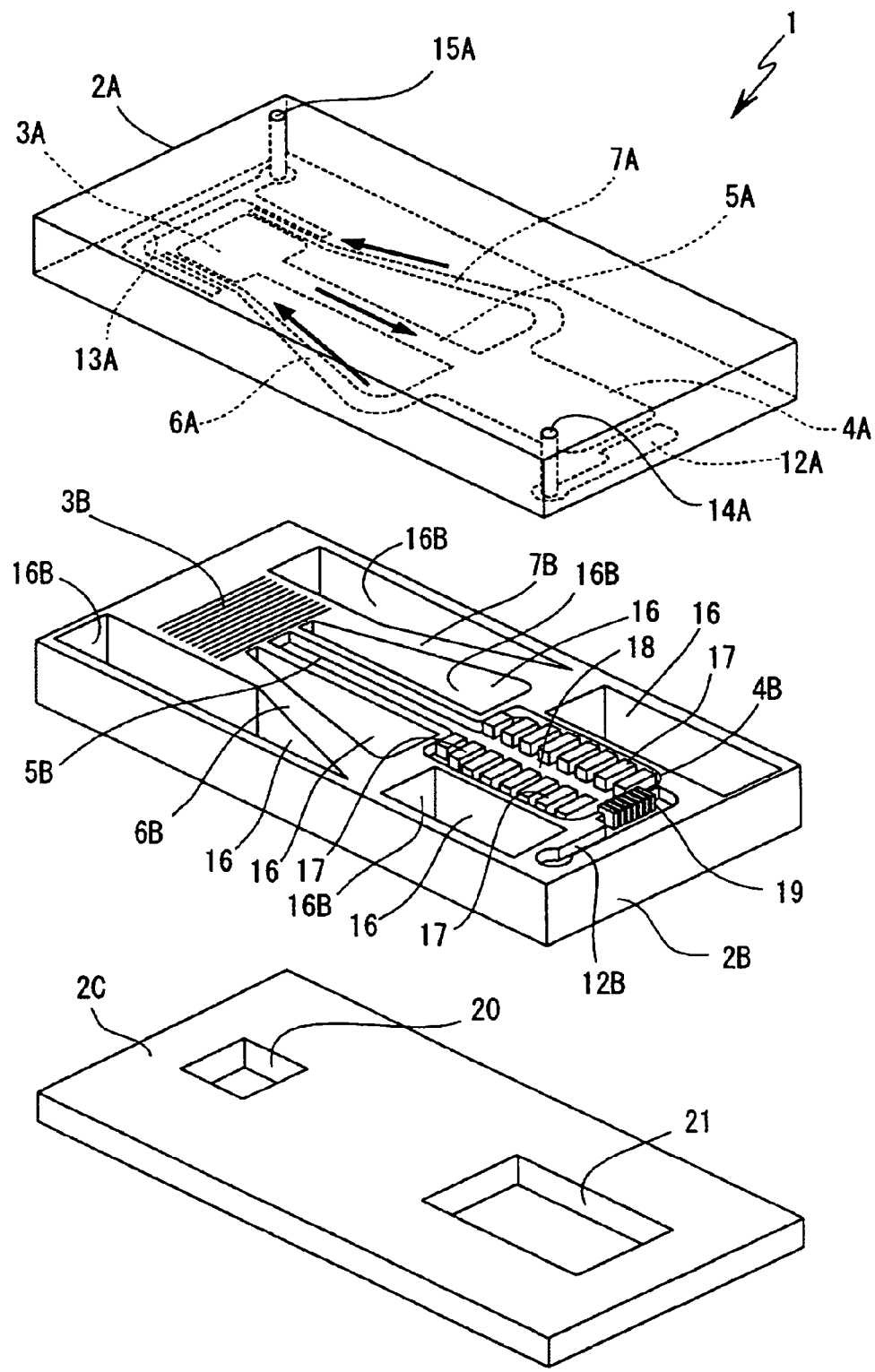
FIG. 2 is an exploded perspective view of a heat transport device according to an embodiment of the present invention.

FIG. 2 is an exploded perspective view of a heat transport device 1. The heat transport device 1 has a three-layer structure including a first substrate 2A, a second substrate 2B, and a third substrate 2C. The second substrate 2B serving as a center layer is fixed between the substrates 2A and 2C. While the structure is not limited to the three-layer structure, but may be a two-layer structure, for example, when the thickness of the second substrate 2B is small, it is preferable that the second substrate 2B be held between other substrates (2A and 2C) for the purpose of reinforcement.

First, the first substrate 2A will be described with reference to FIGS. 2 to 7. The heat transport device 1 of this embodiment includes two liquid channels and one vapor channel. In FIG. 2, the direction of flow of working fluid in the first substrate 2A is shown by the bold arrows.

Figure 4A:
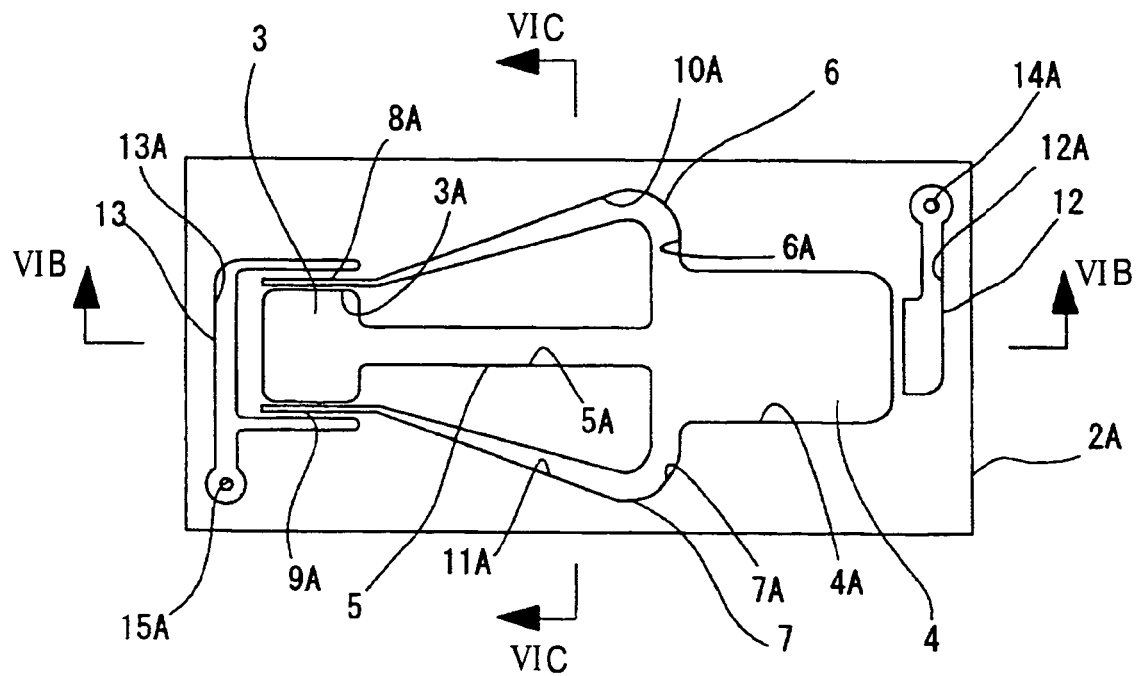
FIG. 4A is a plan view showing channels, an evaporator, a condenser, and so on provided in a first substrate.
Figure 4B:
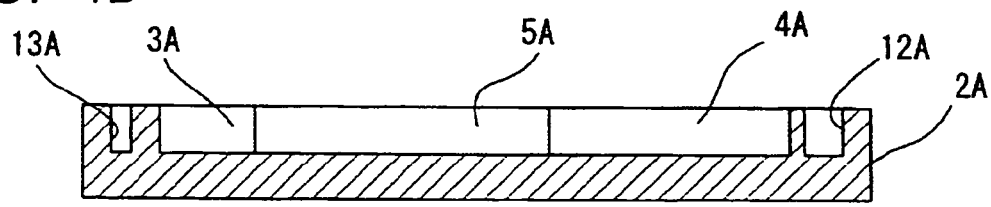
FIG. 4B is a cross-sectional view taken along line VIB—VIB in FIG. 4A.
Figure 4C:
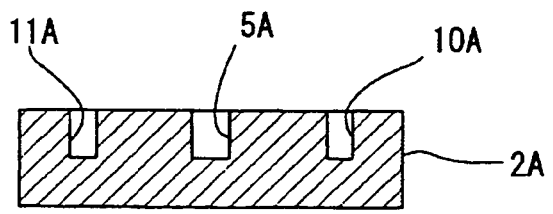
FIG. 4C is a cross-sectional view taken along line VIC—VIC in FIG. 4A.
Figure 7:
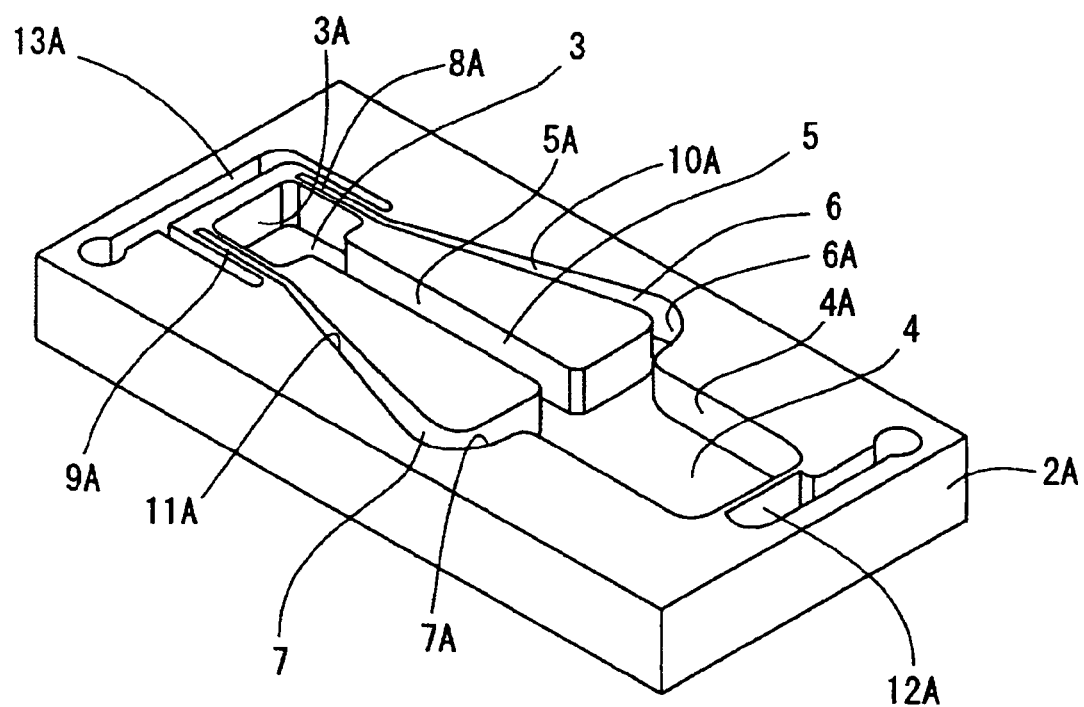
FIG. 7 is a perspective view showing channels and so on provided on the first substrate in order to explain the production processes in conjunction with FIGS. 8 and 9.

As shown in FIGS. 4 and 7, one surface (inner surface) of the first substrate 2A has a groove (recess) 3A that constitutes an evaporator 3, and a groove (recess) 4A that constitutes a condenser 4.

A groove 5A serving as a vapor channel 5 extends straight, and connects the evaporator 3 and the condenser 4. Two liquid channels 6 and 7 also connect the evaporator 3 and the condenser 4, and are symmetrically arranged with respect to the center axis extending through the vapor channel 5. That is, a groove 6A that constitutes the liquid channel 6 and a groove 7A that constitutes the liquid channel 7 form a fork shape with the center groove 5A of the vapor channel 5. The grooves 6A and 7A extend between an end of the groove 4A of the condenser 4 and an end of the groove 3A of the evaporator 3, and adjacent to the outermost edges of the heat transport device 1. For example, as shown in FIG. 4A, the groove 6A connected to the upper left end of the groove 4A of the condenser 4 is curved, gradually decreases in width toward the groove 3A of the evaporator 3, and reaches the narrowest straight portion 8A provided adjacent to the groove 3A. The groove 7A connected to the lower left end of the groove 4A of the condenser 4 is curved, gradually decreases in width toward the groove 3A of the evaporator 3, and reaches the narrowest straight portion 9A provided adjacent to the groove 3A. In this way, the grooves 6A and 7A respectively have paths 10A and 11A that gradually decrease in width toward the evaporator 3.

Since the two liquid channels 6 and 7 are symmetrically arranged with respect to the axis passing through the centers of the vapor channel 5, the evaporator 3, and the condenser 4, working fluid uniformly flows in the liquid channels, and there is little difference in resistance, flow rate, and so on among the liquid channels.

While the vapor channel 5 has the straight groove 5A, and the cross-sectional area thereof is fixed, the cross-sectional area may be changed gradually.

Grooves 12A and 13A constitute supply channels 12 and 13 for supplying working fluid. For example, as shown in FIG. 4A, the groove 12A is provided on the right side of the groove 4A of the condenser 4. The substantially angular-U groove 13A is provided on the left side of the groove 3A of the evaporator 3 and by the sides of the straight portions 8A and 9A.

Figure 3:
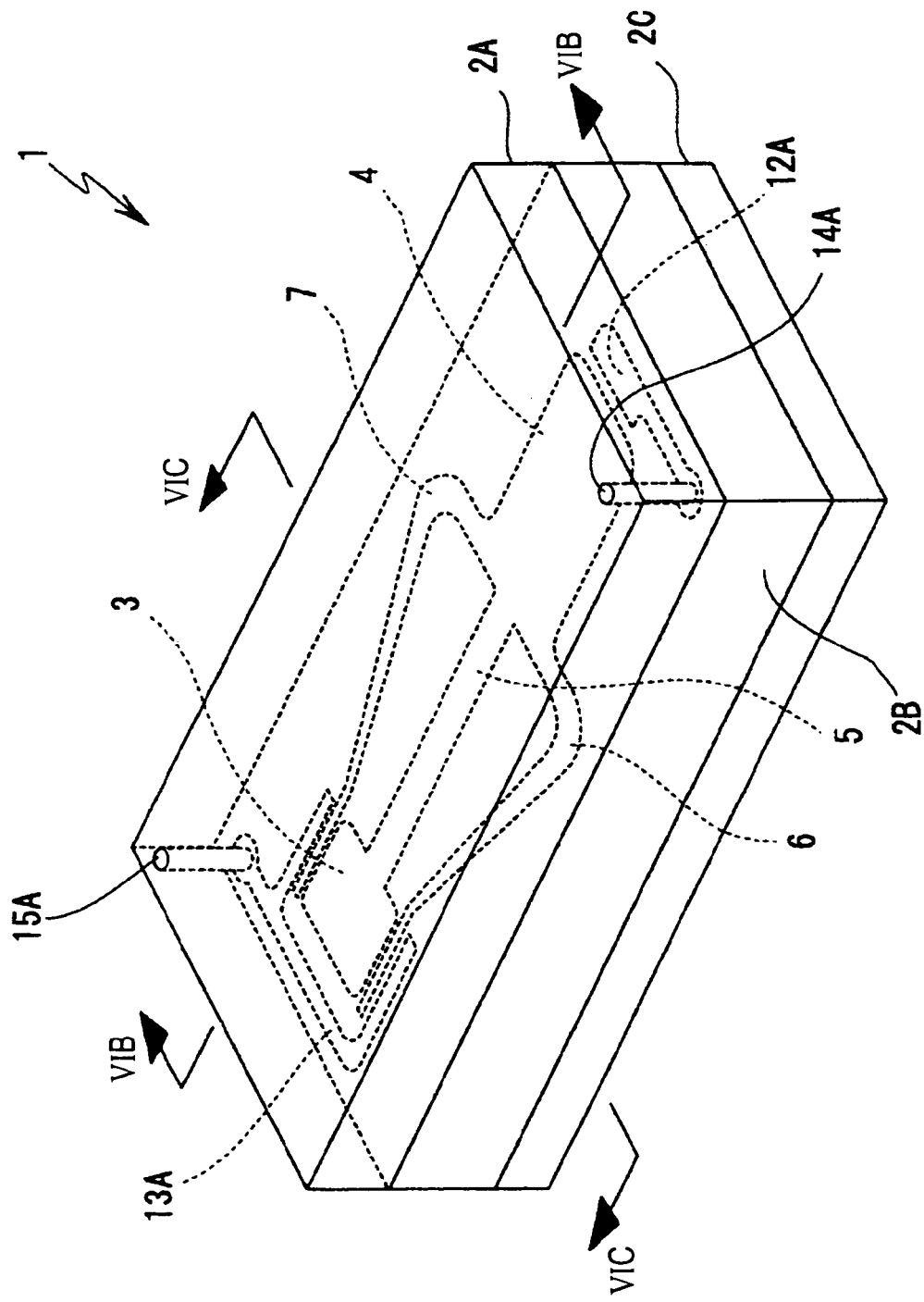
FIG. 3 is a perspective view of the heat transport device shown in FIG. 2 after assembly.

Referring to FIGS. 2 and 3, supply holes 14A and 15A for working fluid are provided through the other surface (outer surface) of the first substrate 2A to communicate with the supply channels 12A and 13A. That is, working fluid is supplied from the supply hole 14A to the condenser 4 through the supply channel 12, and from the supply hole 15A to the evaporator 3 through the supply channel 13. The supply holes 14A and 15A are closed by a cover or the like except when supplying the working fluid.

The material of the first substrate 2A is, for example, glass, or synthetic resin such as polyimide, polytetrafluoroethylene, or PDMS (polydimethylsiloxane). This is because, when the first substrate 2A is made of a material having an exceedingly high thermal conductivity, the thermal diffusion by the substrate may have an adverse effect on the heat transport efficiency of the heat transport device 1. The grooves of the vapor channel 5, the liquid channels 6 and 7, the evaporator 3, the condenser 4, and the supply channels 12 and 13 are formed in the first substrate 2A, for example, by sand blasting, RIE (dry etching), wet etching, UV (ultraviolet) etching, laser etching, proton-beam etching, electron beam etching, or micromolding.

The second substrate 2B will now be described with reference to FIGS. 2, 3, 5, 6, and 8.

Figure 8:
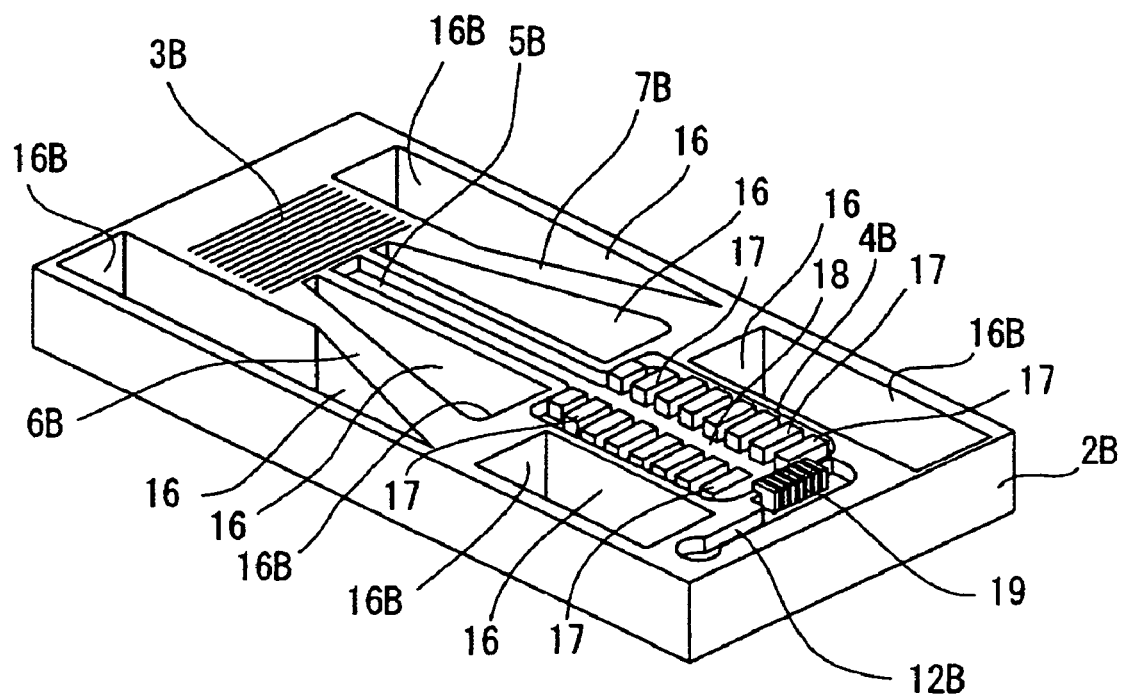
FIG. 8 is a perspective view showing wicks, insulating sections, and so on provided on a second substrate.

Referring to FIGS. 2 and 8, the second substrate 2B includes an evaporator wick 3B for evaporating working fluid, a condenser wick 4B for condensing the working fluid, liquid-channel sealing portions 6B and 7B, a groove 5B in the vapor channel 5, insulating sections 16, and so on.

The evaporator wick 3B constitutes the evaporator 3 with the above-described groove 3A, and has an uneven shape with fine grooves extending in a predetermined direction.

The condenser wick 4B constitutes the condenser 4 with the above-described groove 4A, and has pits and projections formed in a rectangular recess having a predetermined depth. That is, in the first embodiment, grooves are provided between multiple ribs 17.

The groove 5B is provided corresponding to the above-described groove 5A to constitute the vapor channel 5 with the groove 5A. Both the first and second substrates 2A and 2B are provided with the grooves 5A and 5B in order to increase the cross-sectional area of the vapor channel 5, because the velocity of flow of vapor-phase working fluid from the evaporator 3 to the condenser 4 is high. The groove 5B is connected to an even straight path 18 in the condenser wick 4B, thereby securing a vapor channel to the condenser 4 (that is, the straight path 18 serves as a vapor channel, and vapor-phase working fluid smoothly enters the condenser 4 to condense by radiating heat).

The liquid-channel sealing portions 6B and 7B close the grooves 6A and 7A provided in the first substrate 2A in order to form channels for working fluid and to prevent the working fluid from flowing out of the channels. That is, the sealing portion 6B is shaped like a flat surface corresponding to the groove 6A, and constitutes the liquid channel 6 in a state in which the substrates 2A and 2B are combined. Similarly, the sealing portion 7B is shaped like a flat surface corresponding to the groove 7A, and constitutes the liquid channel 7 in a state in which the substrates 2A and 2B are combined. The liquid channels 6 and 7 include the grooves 6A and 7A provided only in the first substrate 2A, but do not include a groove in the second substrate 2B in order to prevent vapor-phase working fluid from flowing therein.

A groove 12B constitutes the supply channel 12, and is provided corresponding to the groove 12A of the first substrate 2A, that is, by the side of the condenser wick 4B. Pits and projections 19 having a pitch smaller than that of the above-described ribs 17 are provided at the boundary between the groove 12B and the condenser wick 4B. A portion of the second substrate 2B corresponding to the groove 13A of the first substrate 2A is flat, and does not have a groove. That is, the second substrate 2B has the groove 12B only in the supply channel 12, considering that incompressible vapor is apt to accumulate. The pits and projections 19 are provided, for example, to prevent the return of the vapor.

As shown in FIGS. 2 and 8, the insulating sections 16 are cavities that are constituted by through holes 16B provided in the second substrate 2B, and portions of the first substrate 2A and the third substrate 2C that closes the through holes 16B. That is, the cavities are formed by sandwiching the through holes 16B provided in the center and on the periphery of the second substrate 2B between the first substrate 2A and the third substrate 2C. In this embodiment, the two cavities in the center of the second substrate 2B are provided between the vapor channel 5 and the liquid channels 6 and 7. The cavities on the periphery of the second substrate 2B are provided on both sides of the evaporator 3 and the liquid channels 6 and 7, and on both sides of the condenser 4.

While the interiors of the insulating sections 16 are preferably placed in a reduced-pressure state, they may be filled with a gas having a low thermal conductivity, for example, air, nitrogen, or argon. The insulating sections 16 are highly effective in suppressing heat conduction, particularly, in suppressing heat transport between the third substrate 2C, and the vapor channel 5 and the liquid channels 6 and 7.

Preferably, the second substrate 2B is composed of a material having a high thermal conductivity, for example, silicon (Si). However, the material is not limited to silicon, it may include a metal such as Cu, Al, Ni, Au, Ag, or Pt, or a conductive polymer or ceramic having a thermal conductivity equivalent to that of metal.

The grooves of the evaporator wick 3B and the condenser wick 4B, the though holes 16B of the insulating sections 16, and the groove 5B of the vapor channel 5 are formed, for example, by sand blasting, RIE (dry etching), wet etching, UV (ultraviolet) etching, laser etching, proton-beam etching, electron beam etching, or micromolding.

The third substrate 2C will now be described with reference to FIGS. 2, 3, 5, 6, and 9.

The third substrate 2C includes a first connecting hole 20 and a second connecting hole 21 that face a surface of the second substrate 2B remote from the evaporator wick 3B and the condenser wick 4B.

The first connecting hole 20 is provided corresponding to the back side of the evaporator wick 3B, and the second connecting hole 21 is provided corresponding to the back side of the condenser wick 4B. A device serving as a heat source (a heating element such as a CPU, a graphic chip, a driver IC) is connected to the back side of the evaporator wick 3B through the first connecting hole 20, and heat from the device is transmitted to the evaporator 3 for cooling. On the other hand, a radiating means (e.g., a radiating fin for radiating heat to the outside) or a cooling means is provided on the back side of the condenser wick 4B through the second connecting hole 21.

The material of the third substrate 2C is, for example, glass, or synthetic resin such as polyimide, polytetrafluoroethylene, or PDMS (polydimethylsiloxane), because, when the third substrate 2C is made of a material having an exceedingly high thermal conductivity, the thermal diffusion by the substrate may have an adverse effect on the heat transport efficiency of the heat transport device 1, in a manner similar to that in the first substrate 2A. The first connecting hole 20 and the second connecting hole 21 are formed in the third substrate 2C, for example, by sand blasting, RIE (dry etching), wet etching, UV (ultraviolet) etching, laser etching, proton-beam etching, electron beam etching, or micromolding.

Examples of working fluid are water, ethanol, methanol, propanol (including an isomer), ethyl ether, ethylene glycol, Fluorinert™, and ammonia. One of these coolants, which has the characteristics, such as the boiling point and anti-bacterial activity, that satisfy the design requirements of the heat transport device 1, is used. The working fluid is supplied from the supply holes 14A and 15A into the heat transport device 1 in a reduced-pressure atmosphere.

As described above, the heat transport device 1 of this embodiment has a three-layer structure composed of the first to third substrates 2A to 2C. The liquid channels 6 and 7 and the vapor channel 5 are provided between the second substrate 2B serving as the center layer, and the first substrate 2A joined to the second substrate 2B. This can reduces the size of the device. Moreover, since the insulating sections 16 can be formed integrally with the substrates, the size and width of the heat transport device 1 can be reduced. In particular, when a plurality of liquid channels and vapor channels need to be provided in a limited space, the distance therebetween is short. In such a case, it is highly effective to provide the insulating sections between the channels.

Next, the operation of the heat transport device 1 will be described.

Liquid-phase working fluid flowing toward the evaporator 3 through the liquid channels 6 and 7 permeates from the straight portions 8A and 9A, and spreads throughout the evaporator wick 3B because of the capillary force of the fine grooves in the evaporator wick 3B. The liquid-phase working fluid is evaporated by heat from the heat source (not shown) mounted on the surface of the second substrate 2B remote from the evaporator 3. That is, the heat from a heating element, such as an electronic device, is transported toward the evaporator wick 3B by heat conduction through the first connecting hole 20 of the third substrate 2C, and is transmitted from the surface of the evaporator wick 3B to the working fluid by heat transmission.

The evaporated working fluid flows into the condenser 4 through the vapor channel 5. In the condenser wick 4B, the vapor-phase working fluid radiates latent heat and returns its phase to a liquid phase again. The heat radiated from the working fluid is transmitted to a radiating means, such as a radiating fin, through the second connecting hole 21 of the third substrate 2C, and is emitted outside. The liquid-phase working fluid flows through the fine grooves of the condenser wick 4B because of the capillary force of the condenser wick 4B, and flows from the condenser 4 toward the evaporator wick 3B of the evaporator 3 through the liquid channels 6 and 7. These heat transport processes are repeatedly performed in the heat transport device 1.

Figure 5:
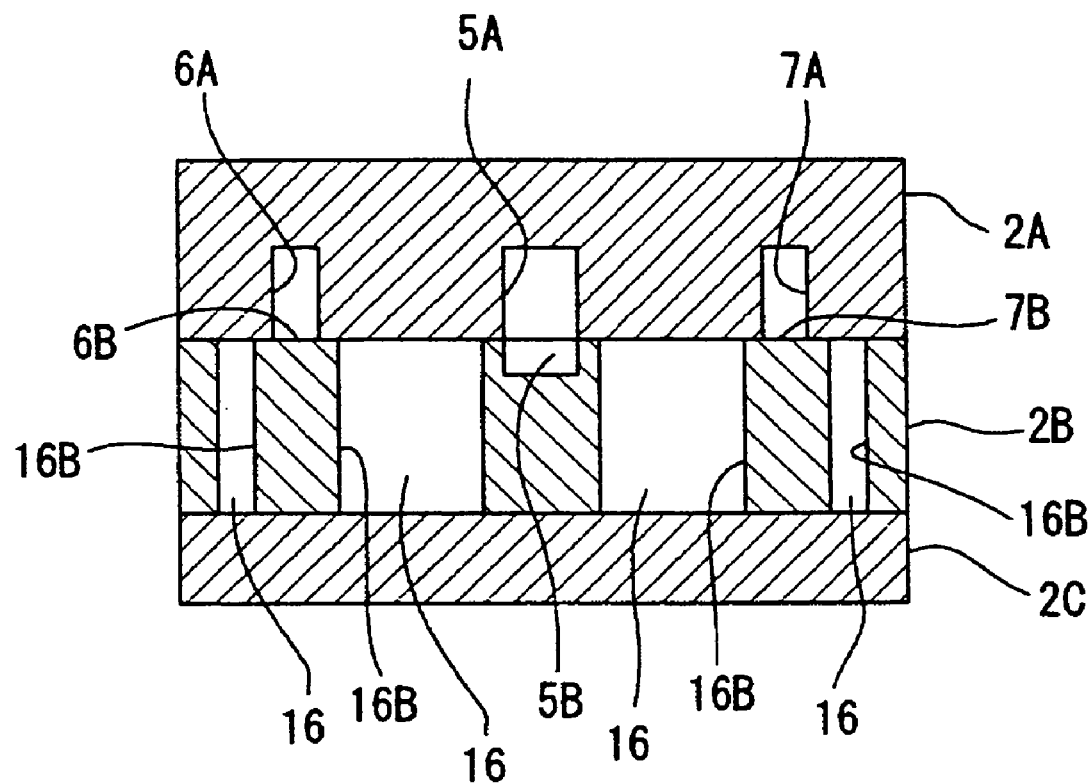
FIG. 5 is an enlarged sectional view, taken along line VIC—VIC in FIG. 3.
Figure 6:
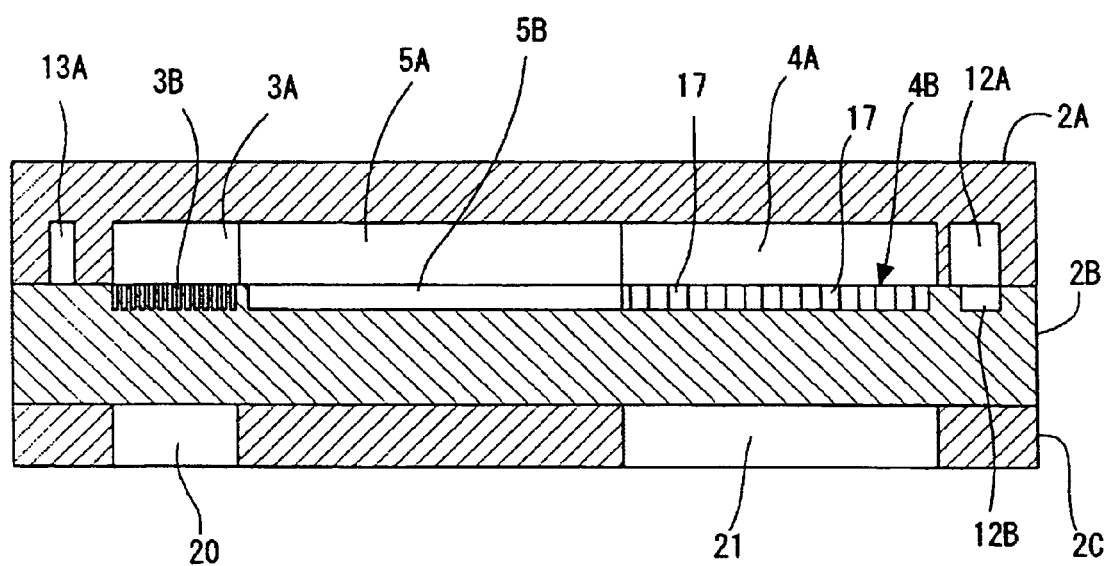
FIG. 6 is an enlarged sectional view, taken along line VIB—VIB in FIG. 3.

In the above heat transport processes, as shown in FIG. 5, the insulating sections 16 are provided in the portions of the second substrate 2B that constitute the vapor channel 5 and the liquid channels 6 and 7, and are shaped like cavities defined by the through holes 16B of the second substrate 2B, and the first and third substrates 2A and 2C. Accordingly, the vapor channel 5 and the liquid channels 6 and 7 are rarely thermally influenced by the third substrate 2C on which the heat source, the radiating means, and the like are mounted. Since the first substrate 2A is composed of a material having a low thermal conductivity, and is less apt to be thermally influenced by the surrounding portions than the third substrate 2C, the degree of heat transmission between the first substrate 2A and the working fluid is low. For this reason, heat exchange between the vapor channel 5 and the liquid channels 6 and 7, and the outside of the heat transport device 1 is suppressed, and the working fluid does not its phase while flowing in the vapor channel 5 and the liquid channels 6 and 7. Consequently, the working fluid can stably flow, and a high heat-transport efficiency can be achieved. The heat exchange through the cavities can be further suppressed by placing the interiors of the cavities in a reduced-pressure state. The effect can be enhanced by filling the interiors of the cavities with a gas having a thermal conductivity lower than that of the material of the substrate.

A production method for the above-described heat transport device 1 will be described with reference to FIGS. 2, 3, and 7 to 9.

As shown in FIG. 7, a groove 5A of a vapor channel 5, a groove 3A of an evaporator 3 communicating with the vapor channel 5, a groove 4A of a condenser 4, and grooves 12A and 13A of supply channels 12 and 13 for working fluid are formed in one (inner) surface of a first substrate 2A, for example, by sand blasting. Supply holes 14A and 15A communicating with the supply channels 12 and 13 are formed in the other (outer) surface of the first substrate 2A.

Subsequently, as shown in FIG. 8, an evaporator wick 3B, a condenser wick 4B, a groove 5B of the vapor channel 5, and through holes 16B of insulating sections 16 are formed in a second substrate 2B, for example, by sand blasting. Grooves are formed in the evaporator wick 3B and the condenser wick 4B.

Figure 9:
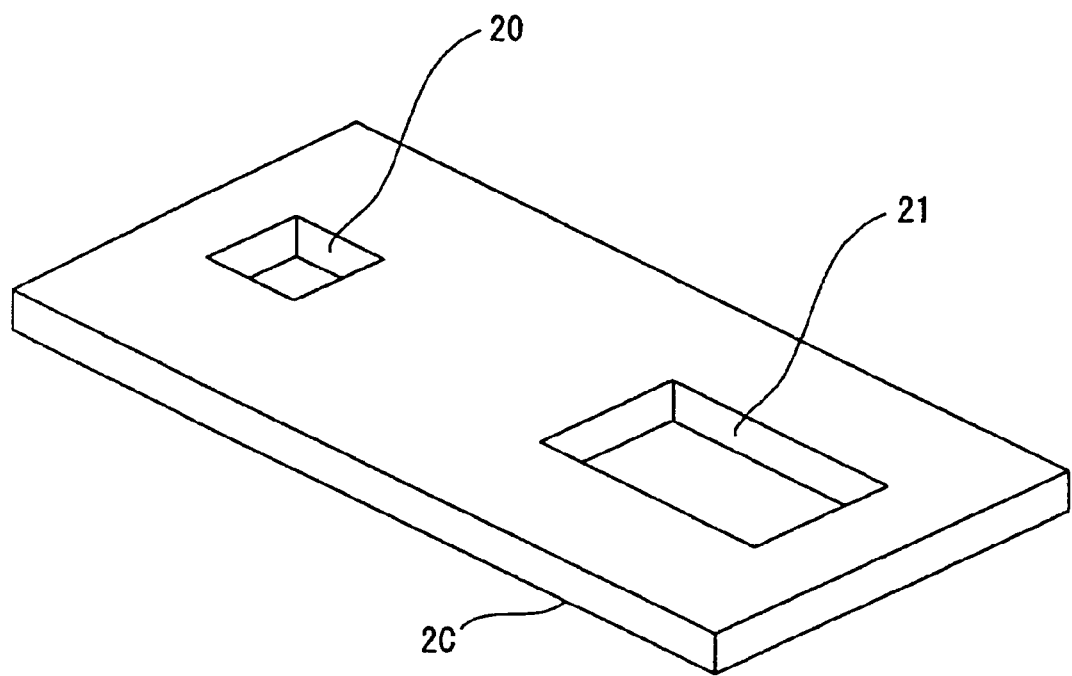
FIG. 9 is a perspective view showing connecting holes provided in a third substrate.

Next, as shown in FIG. 9, a first connecting hole 20 and a second connecting hole 21 are formed in a third substrate 2C, for example, by sand blasting. The first connecting hole 20 is provided corresponding to the back side of the evaporator wick 3B in the second substrate 2B, and the second connecting hole 21 is provided corresponding to the back side of the condenser wick 4B in the second substrate 2B.

As shown in FIGS. 2 and 3, the first substrate 2A and the second substrate 2B are joined while a surface of the first substrate 2A on which the channels (vapor and liquid channels) are provided and a surface of the second substrate 2B on which the evaporator wick 3B and the condenser wick 4B are provided face each other, and the groove 3A of the evaporator 3 and the evaporator wick 3B are aligned and the groove 4A of the condenser 4 and the condenser wick 4B are aligned.

The third substrate 2C is joined to a surface of the second substrate 2B remote from the wicks 3B and 4B while the first connecting hole 20 is aligned with the back side of the evaporator wick 3B and the second connecting hole 21 is aligned with the back side of the condenser wick 43 (see FIGS. 2 and 3). Arrangement and setting are made so that heat is transmitted from a heating device or the like to the second substrate 2B through the first connecting hole 20, and so that heat from the condenser 4 in the second substrate 2B is transmitted to a radiating means or the like through the second connecting hole 21 and is radiated outside.

For example, when the second substrate 2B is made of a glass substrate, amorphous silicon hydride (a-Si:H) films are formed on both bonding surfaces of the second substrate 2B, and the bonding surfaces are joined to the first substrate 2A and the third substrate 2C by anode coupling. The joining method is not limited to anode coupling, and various methods, for example, adhesive bonding using resin as adhesive, compression bonding such as thermal compression, and weld bonding such as laser welding, may be used.

The three substrates 2A, 2B, and 2C are bonded in a reduced-pressure atmosphere, and the interiors of the insulating sections 16 formed by the bonding are thereby placed into a reduced-pressure state. The bonding may be performed in an atmosphere of a gas having a low thermal conductivity, for example, air, nitrogen, or argon.

Working fluid is supplied into the heat transport device 1 through the supply holes 14A and 15A provided in the first substrate 2A in a reduced-pressure atmosphere, and the supply holes 14A and 15A are closed, thereby completing the production of the heat transport device 1.

The processes of the above-described production method for the heat transport device 1 are itemized as follows:

(1) a channel forming process for forming, in substrates, liquid channels through which liquid-phase working fluid flows, a vapor channel through which vapor-phase working fluid flows, and wicks for generating the capillary force in order to circulate the liquid-phase working fluid;

(2) an insulating-section forming process for forming, in the substrates, insulating sections in a substrate along the liquid channels and the vapor channel; and (3) a sealing process for hermetically sealing the insulating sections in a reduced-pressure atmosphere.

The above processes (1) and (2) may be combined into one process. The sealing process (3) may be performed in an atmosphere of a gas having a thermal conductivity lower than that of the material of the substrates.

In this production method, since the insulating sections are provided along the vapor channel and the liquid channels in the substrates, heat exchange between the vapor and liquid channels and the outside of the heat transport device is suppressed, and the working fluid can flow stably.

The heat transport device 1 provide the following advantages:

(1) Since the insulating sections 16 are formed in the second substrate 2B adjacent to the vapor channel 5 and the liquid channels 6 and 7, they reduce the thermal influence of the third substrate 2C close to the heat source.

(2) Since the first substrate 2A is composed of a material having a low thermal conductivity and is less apt to be thermally influenced by the surrounding components than the third substrate 2C, heat transmission between the first substrate 2A and the working fluid can be reduced. As a result, phase changes, such as liquefaction of the working fluid inside the vapor channel 5 and vaporization of the working fluid inside the liquid channels 6 and 7, will not occur.

(3) Since the insulating sections 16 can be formed integrally with the substrates, the size and width of the heat transport device 1 can be reduced.

While the heat transport device 1 has a three-layer structure composed of the three substrates 2A, 2B, and 2C and the liquid channels and the vapor channel are provided between the second substrate 2B serving as the center layer and the first substrate 2A in the above-described embodiment, the present invention is not limited to the embodiment. For example, the heat transport device may include two first and second substrates joined to each other, an evaporator, and a condenser. In this case, grooves of a vapor channel, liquid channels, and insulating sections are formed on bonding surfaces of the first and second substrate that constitute a base. Holes of the evaporator and the condenser are formed in one of the substrates to communicate with the vapor channel and the liquid channels, and grooves of an evaporator wick and a condenser wick are inserted from the holes, and the substrates are then bonded. A heating device or the like is connected to a surface of the evaporator wick remote from the grooves, and a radiating fin or the like is mounted on a surface of the condenser wick remote from the grooves.

In short, any configuration may be adopted in which insulating sections that are placed in a reduced-pressure state or are filled with a gas having a low thermal conductivity are provided around the vapor channel and the liquid channels formed in the substrates. The above-described configuration, materials, and the like may be changed as required.

What is claimed is:

1. An electronic device having a heat transport mechanism, wherein the heat transport mechanism comprises:

an evaporator which has a structure for generating a capillary force to circulate working fluid, to which a heating section is thermally connected, and in which liquid-phase working fluid evaporates;

a condenser in which vapor-phase working fluid condenses;

a plurality of liquid channels through which the liquid-phase working fluid flows, and which connect the evaporator and the condenser; and at least one vapor channel through which the vapor-phase working fluid flows, wherein the plurality of liquid channels, the vapor channel, the evaporator, and the condenser are provided in a same substrate structure, an insulating section is provided along the plurality of liquid channels and the at least one vapor channel to suppress heat transmission between the plurality of liquid channels and the at least one vapor channel and an outside, or between the plurality of liquid channels and the at least one vapor channel, and the insulating section is a cavity defined by a through hole provided in a portion of the substrate structure, where the through hole is provided in a second substrate sandwiched between a first substrate and a third substrate portion of the substrate structure, the first substrate and the third substrate portion close the through hole.

* * * * *